(12) United States Patent
Tsai

(10) Patent No.: US 7,572,029 B2
(45) Date of Patent: Aug. 11, 2009

(54) STRUCTURE OF A LIGHT EMITTING DIODE

(76) Inventor: Hua-Hsin Tsai, No. 105, Jhongyang Rd., Jioucyong Village, Linnei Township, Yunlin County (TW)

( * ) Notice: Subject to any disclaimer, the term of this patent is extended or adjusted under 35 U.S.C. 154(b) by 133 days.

(21) Appl. No.: 11/797,110

(22) Filed: May 1, 2007

(65) Prior Publication Data
US 2008/0273336 A1    Nov. 6, 2008

(51) Int. Cl.
*F21V 1/00* (2006.01)

(52) U.S. Cl. .................. 362/235; 362/247; 362/84

(58) Field of Classification Search .................. 362/84, 362/231, 296, 800, 235, 240, 247; 257/100
See application file for complete search history.

(56) References Cited

U.S. PATENT DOCUMENTS 7,144,131 B2 * 12/2006 Rains ......................... 362/231
2005/0099808 A1 * 5/2005 Cheng et al. ................. 362/231
2006/0186431 A1 * 8/2006 Miki et al. ................... 257/100

* cited by examiner

*Primary Examiner*—Ali Alavi
(74) *Attorney, Agent, or Firm*—Rosenberg, Klein & Lee

(57) ABSTRACT

A light emitting diode includes a base board, at least one light emitting diodes fitted on an upper side of the base board, and a light shade made of either of glass and quartz, which is secured over said at least one light emitting diodes on the base board; the light shade has a fluorescent powder layer on a top thereof for changing color of light; the light shade has a reflecting layer on lateral wall portions thereof for reflecting light produced by the light emitting diodes such that light gathers at the top of the light shade to be brighter; furthermore, in manufacturing, the lateral wall portions of the light shade are soaked in and etched with hydrofluoric acid so as to have irregular depressions and lumps on the surfaces to enhance reflectivity of the reflecting layer.

10 Claims, 6 Drawing Sheets

STRUCTURE OF A LIGHT EMITTING DIODE

BACKGROUND OF THE INVENTION

1. Field of the Invention

The present invention relates to an improvement on a light emitting diode structure, more particularly one, which includes a light shade made of either of glass and quartz; the light shade has a fluorescent powder layer on a top thereof to increase light emitting efficiency, and a reflecting etched layer on lateral wall portions thereof to help to increase brightness.

2. Brief Description of the Prior Art

Simple single-color bulbs were used as the light-producing devices of lamps in early days, which have several drawbacks, e.g. having long reaction time and short service life, consuming too much power, and getting hot rapidly. And, a different-color lampshade has to be positioned around such a conventional single-color bulb in order to change the color of light from the lamp. However, the lampshade will reduce brightness of light from the lamp.

Because light emitting diodes (LED) have many advantages over conventional bulbs, e.g. consuming much less power, and having longer service life, better durability, higher resistance to shock, smaller size, and much shorter reaction time, they are gradually taking the place of bulbs as the light-emitting devices of various lamps such as traffic lights, flashlights, ornamental lamps, and taillights and brake lights of cars. In addition, light emitting diodes won't produce heat when emitting light.

The above light emitting diodes include a circuit base board printed with a pattern of electrodes, light-emitting bodies fitted on the circuit base board, a hollow reflecting frame part enclosing the light-emitting bodies, a light shade, and vents formed on at least one of the circuit base board, the hollow reflecting frame part, and the light shade; the light shade is positioned above the light-emitting bodies, and fitted on the hollow reflecting frame part with an air layer existing between the light-emitting bodies and it; the hollow reflecting frame part has reflecting inner sides for reflecting light produced by the light-emitting bodies, which are around a cone-shaped hollowness of the hollow reflecting frame part. In addition, the cone-shaped hollowness of the hollow reflecting frame part becomes gradually bigger towards an upper end thereof.

However, the above light emitting diodes have the following drawbacks:

1. The light shades are made of a mixture of fluorescent powder and epoxy resin, which has been already shaped into cakes. And, the cakes are heated and molded with a mold so as to produce the light shades. It is highly possible for the fluorescent powder not to be uniformly distributed over the light shades, thus causing reduction to brightness and light-emitting efficiency of the light emitting diodes.

2. Because the light shades are made of a mixture of fluorescent powder and epoxy resin, which is prone to yellow, the light emitting diodes are prone to age with their light getting weaker.

SUMMARY OF THE INVENTION

It is a main object of the present invention to provide an improvement on a light emitting diode structure to overcome the above problems.

A light emitting diode structure according to an embodiment of the present invention includes a base board, at least one light emitting diodes fitted on an upper side of the base board, and a light shade made of either of glass and quartz, which is secured over the light emitting diodes on the base board. The light shade has a fluorescent powder layer on a top for changing color of light, and it has a reflecting layer on lateral wall portions for reflecting light produced by the light emitting diodes such that light gathers at the top of the light shade to become brighter. Furthermore, in manufacturing, the lateral wall portions of the light shade are soaked in and etched with hydrofluoric acid so as to have irregular depressions and lumps on the surfaces to increase reflectivity of the reflecting layer. Consequently, brightness and light emitting efficiency of the light emitting diode is increased.

BRIEF DESCRIPTION OF THE DRAWINGS

The present invention will be better understood by referring to the accompanying drawings, wherein.

DETAILED DESCRIPTION OF THE PREFERRED EMBODIMENTS

Figure 1:
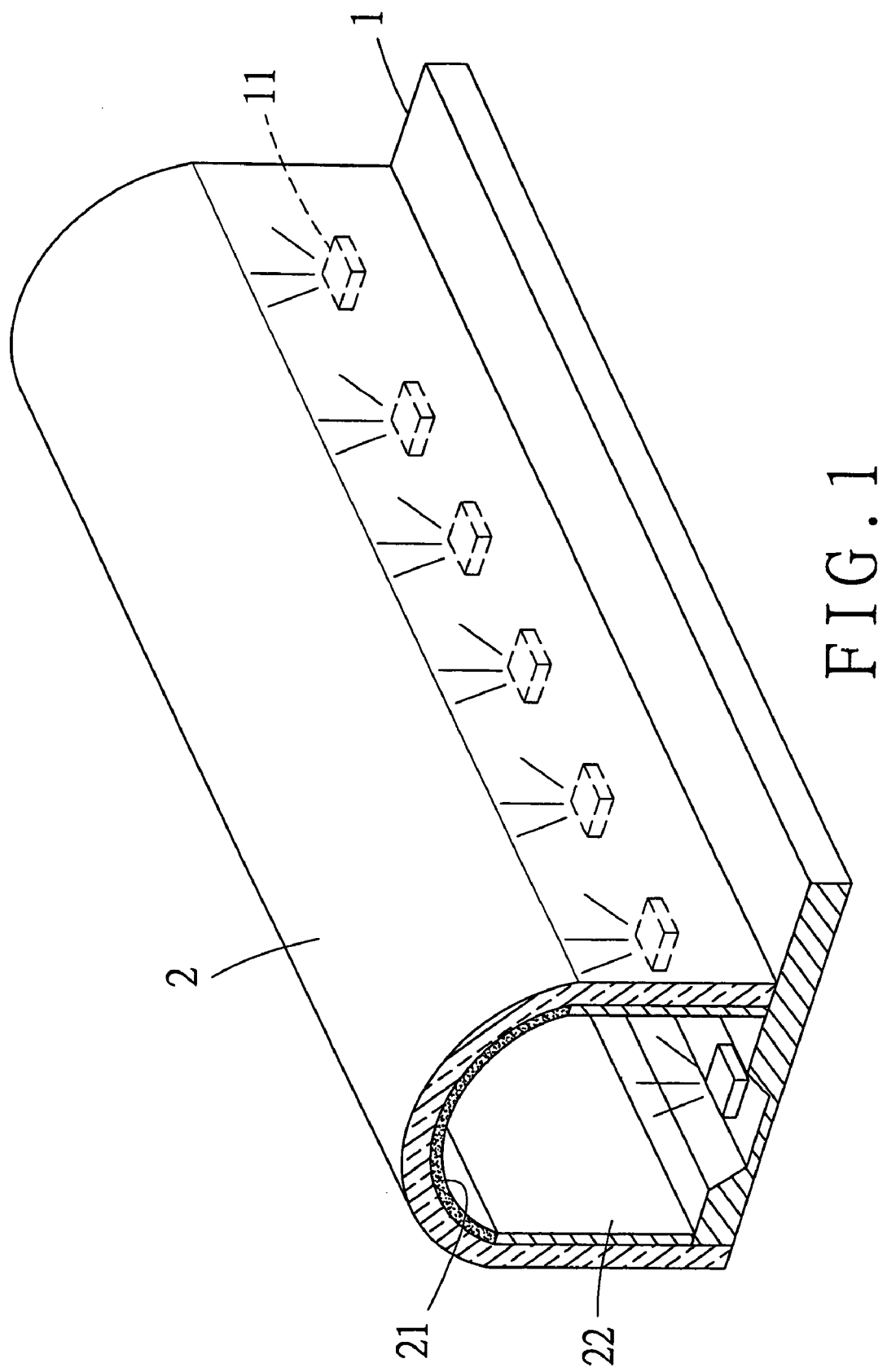
FIG. 1 is a perspective view of the first preferred embodiment in the present invention.
Figure 2:
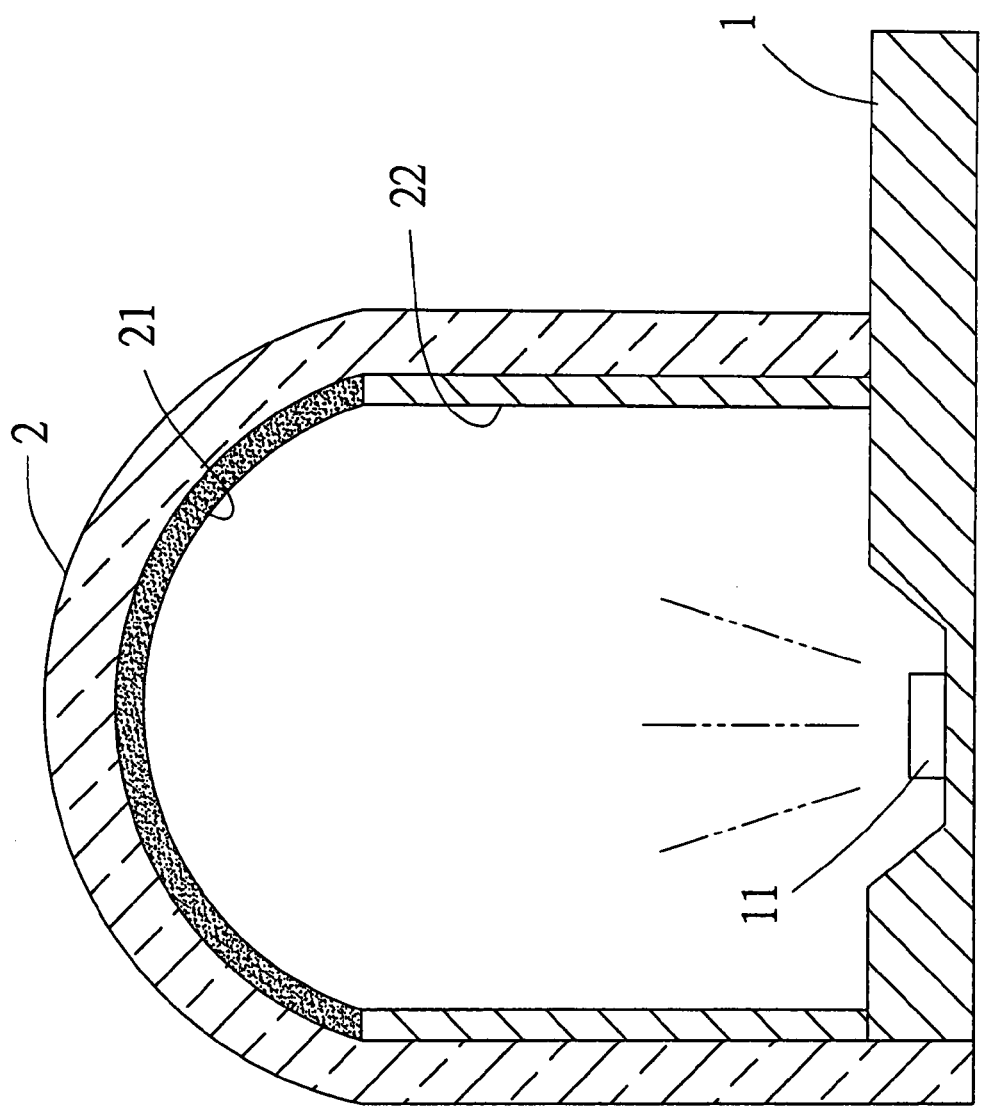
FIG. 2 is a sectional view of the first preferred embodiment.
Figure 3:
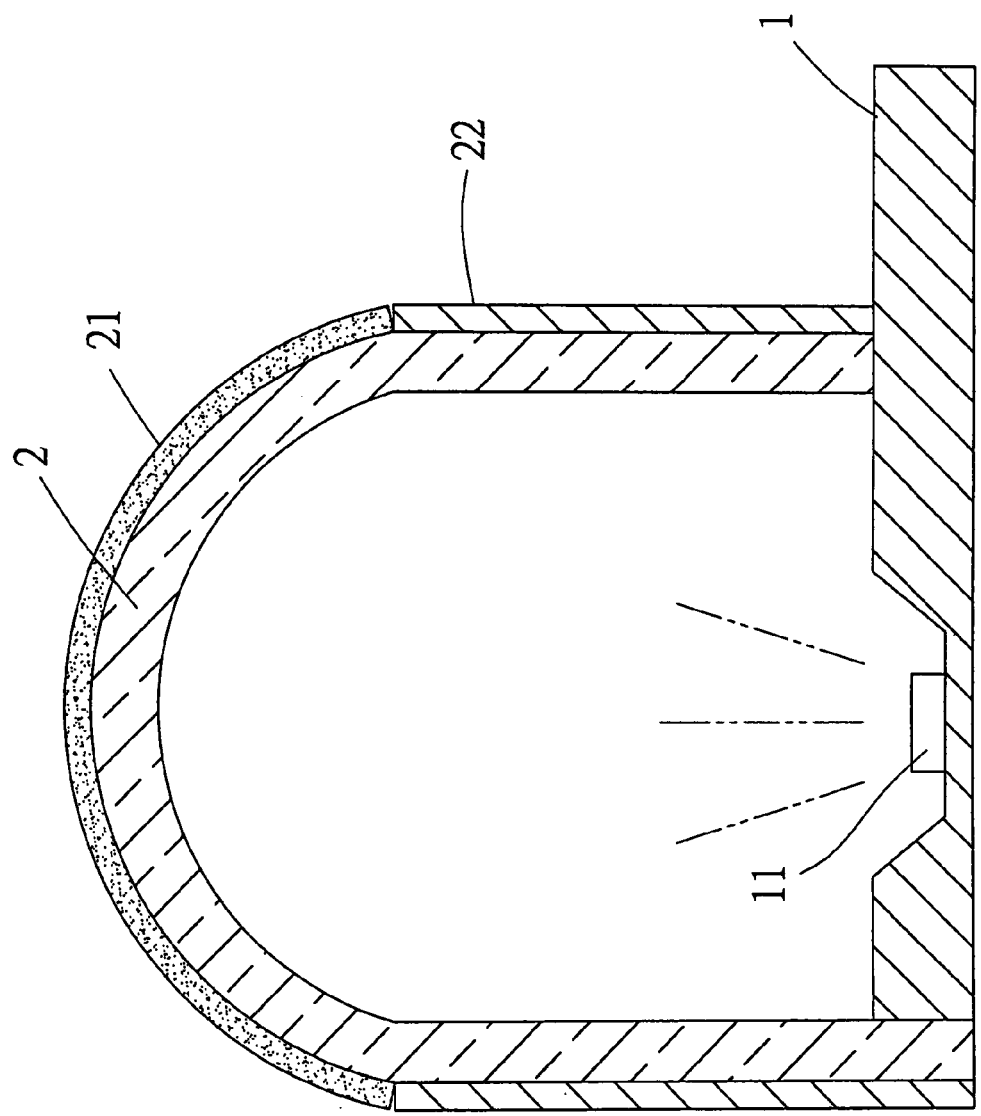
FIG. 3 is a sectional view of the second preferred embodiment.

Referring to FIGS. 1, 2 and 3, a first preferred embodiment (FIGS. 1 and 2) and a second preferred embodiment (FIG. 3) of an improvement on a light emitting diode structure of the present invention each include a base board 1, and a light shade 2.

The base board 1 has one or more than one light emitting diodes 11 fitted on an upper side thereof.

The light shade 2 is secured around the light emitting diodes 11 on the base board 1 to protect the base board 1 and the light emitting diodes 11. The light shade 2 is a pervious-to-light hood, and can be made of glass or quartz. The light shade 2 has an arched top, which is covered with a fluorescent powder layer 21 on either of inner and outer surfaces thereof for changing color of light; in addition, the light shade 2 has lateral wall portions, which each have a reflecting layer 22 on either of inner and outer sides thereof for reflecting light produced by the light emitting diodes 11 such that the light gathers and becomes brighter at the top of the light shade 2. In manufacturing, a surface-processing step is carried out, wherein the lateral wall portions of the light shade 2 are soaked in and etched with hydrofluoric acid; thus, the lateral wall portions have irregular depressions and lumps on the surfaces for helping to increase reflectivity of the reflecting layers 22.

Figure 4:
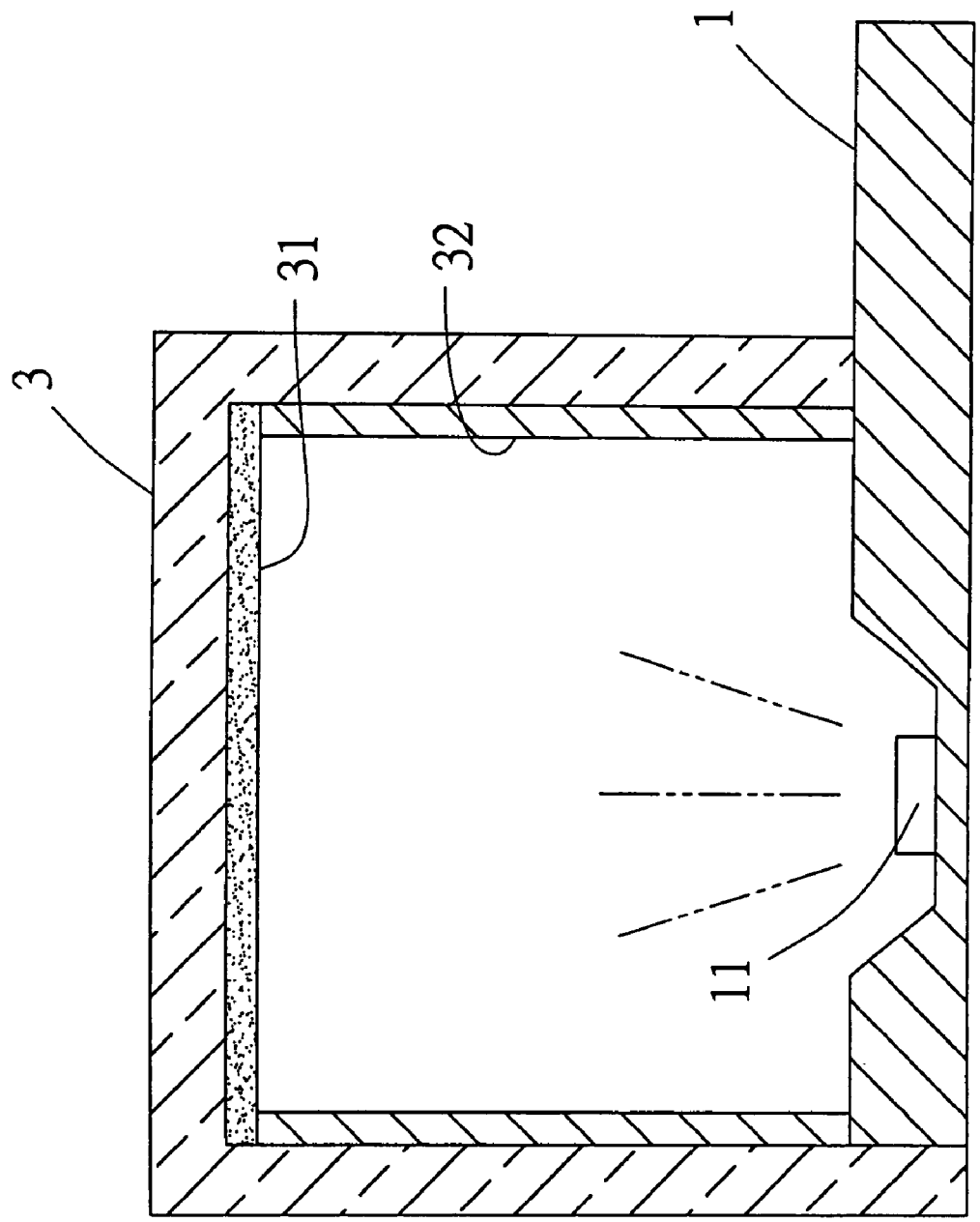
FIG. 4 is a sectional view of the third preferred embodiment.
Figure 5:
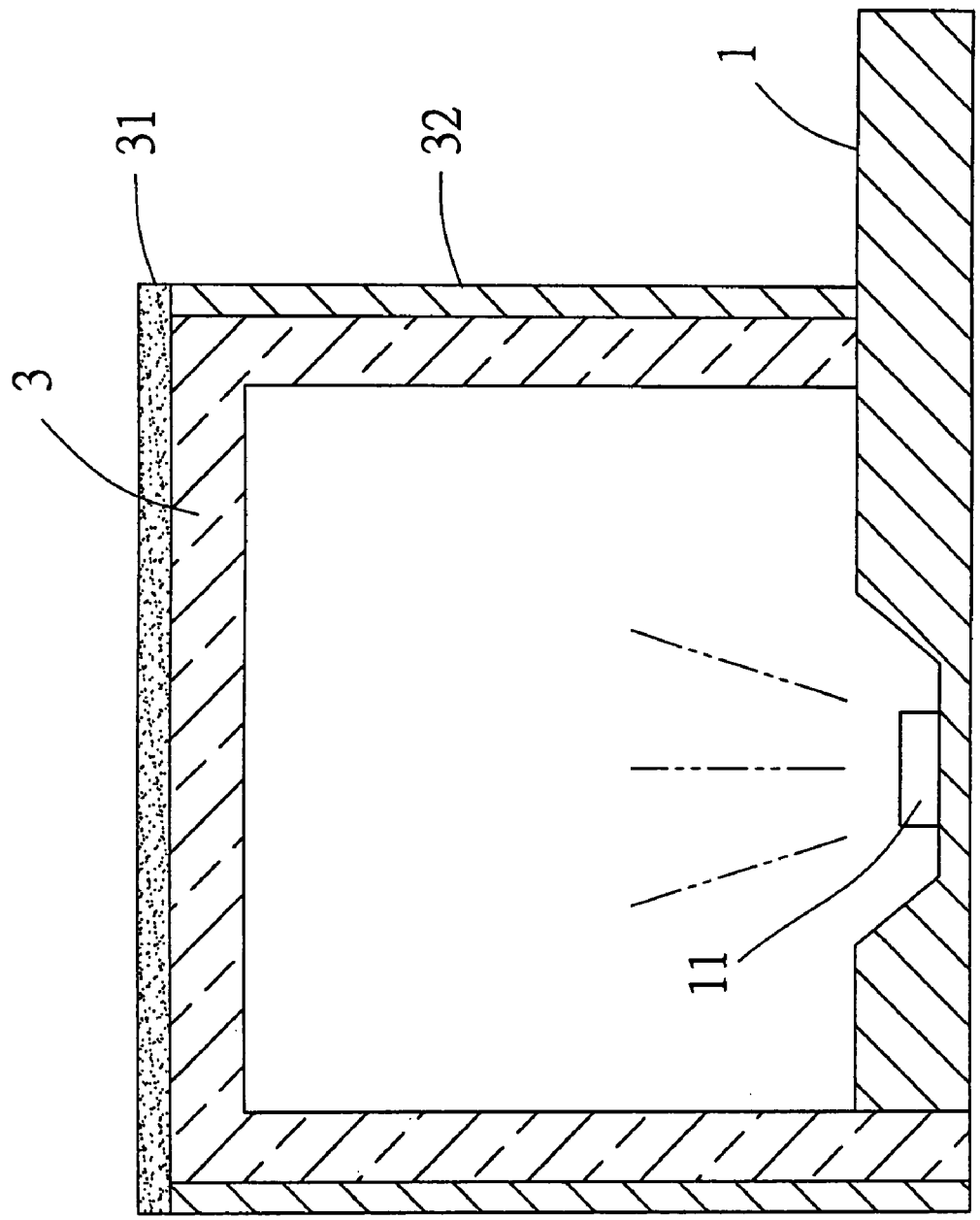
FIG. 5 is a sectional view of the fourth preferred embodiment.

Shown in FIGS. 4 and 5 are third and fourth preferred embodiments of the present invention respectively. The third and the fourth preferred embodiments each include a base board 1, light emitting diodes 11 fitted on the base board 1, and a light shade 3 secured on the base board 11; the light shade 3 has a horizontal planar top, and which is covered with a fluorescent powder layer 31 on either of inner and outer surfaces thereof for changing color of light; furthermore, the light shade 3 has lateral wall portions, which each have a reflecting layer 32 on either of inner and outer sides thereof for reflecting light produced by the light emitting diodes 11 such that the light gathers and becomes brighter at the top of the transparent media adapter 2. In manufacturing, a surface-processing step is carried out, wherein the lateral wall portions of the light shade 3 are soaked and etched in hydrofluoric acid, such that they have irregular depressions and lumps on their surfaces for helping to increase reflectivity of the reflecting layers 32.

Figure 6:
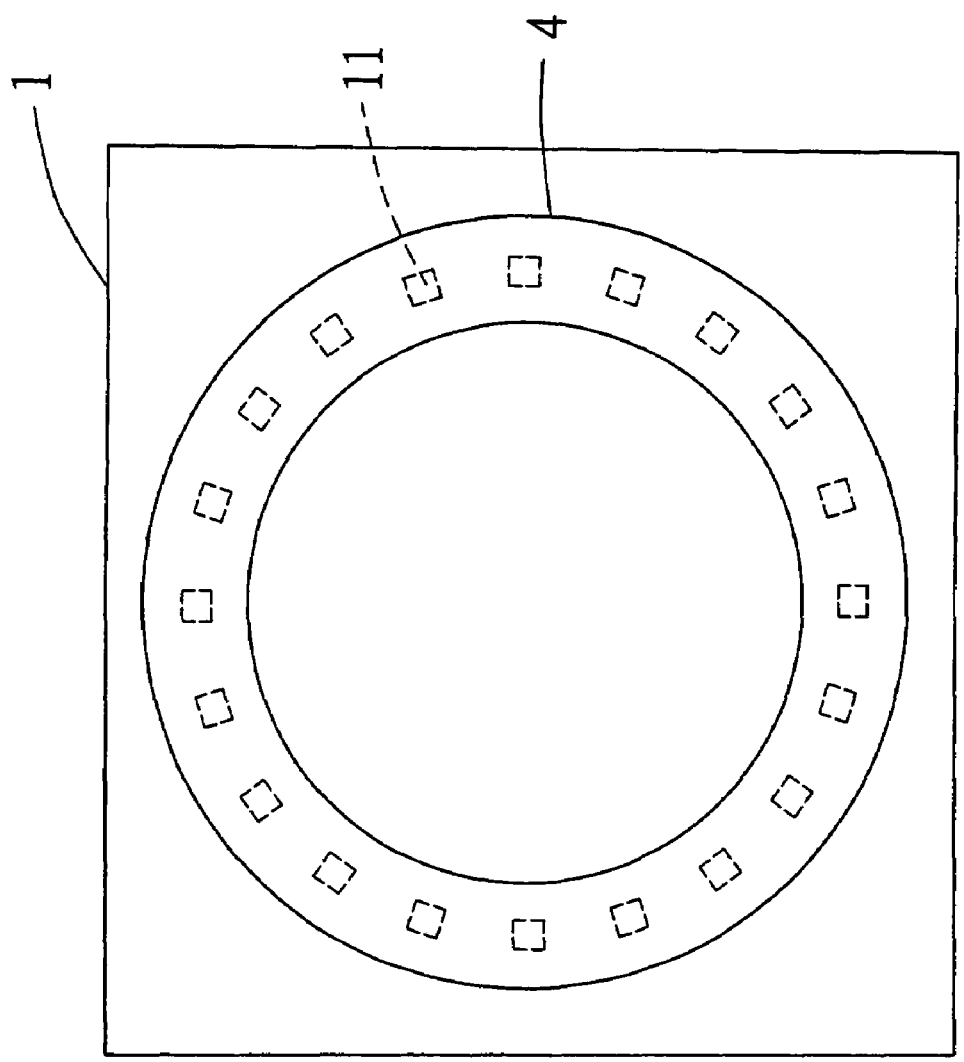
FIG. 6 is a vertical view of the fifth preferred embodiment.

Shown in FIG. 6 is a fifth preferred embodiment of the present invention, which has a base board 1, several light emitting diodes 11 arranged in such a manner as to form an annular pattern on the base board 1, and an annular light shade 4 positioned over all of the light emitting diodes 11 on the base board 1 to protect the base board 1 and the light emitting diodes 11.

From the above description, it can be seen that the present invention has the following advantages:

1. The fluorescent powder layer is added on the top of the light shade made of glass/quartz therefore fluorescent powder is uniformly distributed so as to help to increase brightness and light-emitting efficiency of the light emitting diode.

2. The light shade is made of glass/quartz therefore it doesn't have the disadvantage of the above equivalents made of epoxy resin, which is prone to yellow, thus causing the light emitting diodes to age, and weakening of light emitted from the light emitting diodes.

3. Owing to the reflecting layer on the lateral wall portions of the light shade, light produced by the light emitting diodes will gather at the top of the light shade. Furthermore, in manufacturing, the lateral wall portions of the light shade are etched so as to have irregular depressions and lumps on their surfaces in order for reflectivity of the reflecting layer to increase. Consequently, brightness of the light emitting diode is increased.

What is claimed is:

1. An improvement on a light emitting diode structure, comprising
   a base board, the base board having at least one light emitting diodes fitted on an upper side thereof; and
   a light shade secured around the light emitting diodes on the base board;
   the light shade having a fluorescent powder layer on a top thereof for changing color of light;
   the light shade having a reflecting layer on lateral wall portions thereof for reflecting light produced by the light emitting diodes such that the light gathers to become brighter at the top of the light shade, said lateral wall portions having irregular depressions and lumps on surfaces thereof for helping to increase reflectivity of the reflecting layer formed by the light shade being soaked in and etched with hydrofluoric acid.

2. The improvement on a light emitting diode structure as recited in claim 1, wherein the light shade is a pervious-to-light hood made of glass.

3. The improvement on a light emitting diode structure as recited in claim 1, wherein the light shade is a pervious-to-light hood made of quartz.

4. The improvement on a light emitting diode structure as recited in claim 1, wherein said fluorescent powder layer is on an inner side of said top of the light shade.

5. The improvement on a light emitting diode structure as recited in claim 1, wherein said fluorescent powder layer is on an outer side of said top of the light shade.

6. The improvement on a light emitting diode structure as recited in claim 1, wherein said reflecting layer is on inner sides of said lateral wall portions of the light shade.

7. The improvement on a light emitting diode structure as recited in claim 1, wherein said reflecting layer is on outer sides of said lateral wall portions of the light shade.

8. The improvement on a light emitting diode structure as recited in claim 1, wherein said top of the light shade is arched.

9. The improvement on a light emitting diode structure as recited in claim 1, wherein said top of the light shade is horizontal.

10. The improvement on a light emitting diode structure as recited in claim 1, wherein the light shade is annular.

* * * * *